Aug. 24, 1965 A. J. BARACKET 3,202,837

FREQUENCY DIVIDER EMPLOYING RECEPTACLES HAVING PRESET FREQUENCY RATIO CONNECTIONS FOR STANDARD FREQUENCY PLUG-IN UNITS

Filed Sept. 5, 1962 2 Sheets-Sheet 1

INVENTOR.
ALBERT J. BARACKET
BY Gillette & Virgil
ATTORNEYS

INVENTOR.
ALBERT J. BARACKET
BY Gillette + Virgil
ATTORNEYS

United States Patent Office 3,202,837

Patented Aug. 24, 1965

3,202,837

FREQUENCY DIVIDER EMPLOYING RECEPTACLES HAVING PRESET FREQUENCY RATIO CONNECTIONS FOR STANDARD FREQUENCY PLUG-IN UNITS

Albert J. Baracket, Cedar Grove, N.J., assignor to Diamond Power Specialty Corporation, Lancaster, Ohio, a corporation of Ohio Filed Sept. 5, 1962, Ser. No. 221,539
4 Claims. (Cl. 307—88.5)

This invention relates to frequency dividing circuits and particularly to circuits such as those used in synchronizing generators for controlling the operation of television equipment.

The frequency dividing circuit of the present invention is based upon the use of binary flip-flop dividers, which are circuits having two active elements, usually transistors, interconnected so that one or the other of the two is conductive at any given instant and remains conductive indefinitely until a suitable actuating signal is applied to the circuit to reverse the state of conductivity and to make the other active element conductive instead. For the purpose of frequency division it is common to connect flip-flop circuits in series so that the signal generated in one of them serves as the actuating signal for the next flip-flop circuit which in turn produces a signal that serves as the actuating signal for yet another such circuit, and so on. When flip-flop circuits are used in this way, the output signal has a repetition rate which is $\frac{1}{2}^n$ times the frequency of the input signal, where $n$ is the number of flip-flop circuits in the chain. It is also possible to change the dividing ratio of a set of binary flip-flop circuits so that the divisor will be $2^n - a$ where "$a$" is an integer and is less than $2^n$.

In the manufacture of synchronizing generators for use with commercial television systems the frequency dividing circuits are usually so arranged as to divide an incoming signal in the ratio of 7:1 and 5:1 as well as either 3:1 or 15:1. Normally each frequency dividing circuit is separately engineered but in accordance with the present invention a single type of plug-in circuit may be used with suitable interconnections to achieve all of the different ratios of division necessary for a synchronizing generator. The device includes structure for supporting the individual frequency dividing circuits, which may be arranged on plug-in, insulating boards. The supporting structure supports elements which may be connected to one or more of a group of identical frequency dividing circuits on sub-chassis to change the division ratio from the normal binary value to a lower value. Furthermore, different elements may be arranged to be supported by the main structure so that identical frequency dividing circuits on identical sub-chassis may, when plugged into different positions, produce frequency divisions of 7:1, 5:1, 15:1, 2:1, and 4:1.

This invention will be described in greater detail in connection with the drawings in which—

Figure 1:
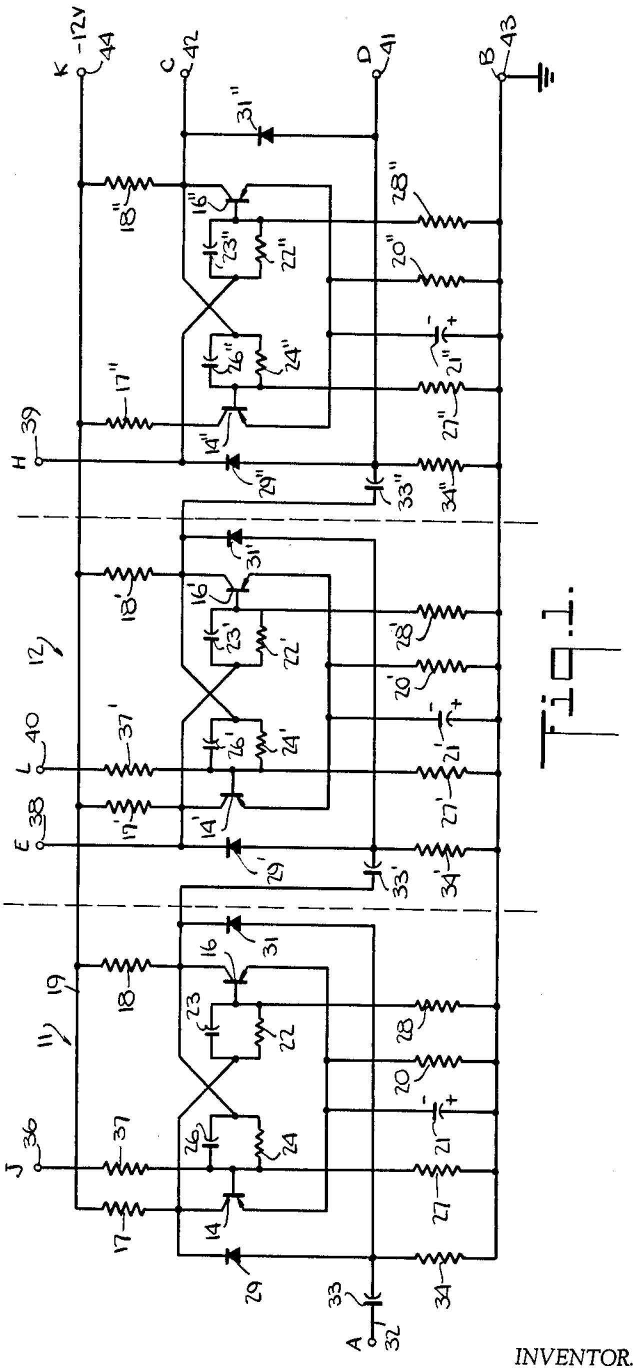
FIG. 1 shows a binary frequency dividing circuit of the type used in the present invention.

The circuit of FIG. 1 includes three identical flip-flop circuits 11, 12, and 13. Circuit 11 includes a first transistor 14 and a second transistor 16 having collector resistors 17 and 18, respectively, connected between the collectors of the transistors and a collector voltage bus 19. The emitters of the two transistors are connected directly together and to ground by way of a resistor 20 which is by-passed by a capacitor 21. The collector of transistor 14 is connected to the base of transistor 16 by a resistor 22 by-passed by a speed-up capacitor 23 for the purpose of obtaining faster operation of the flip-flop circuit, and a corresponding resistor 24 and capacitor 26 are connected between the collector of transistor 16 and the base of the transistor 14. Two resistors 27 and 28 are connected between the bases of transistors 14 and 16, respectively, and ground and two diodes 29 and 31 are connected back-to-back in series between the collectors of the transistors 14 and 16.

The input circuits for the first flip-flop are applied to a terminal 32 which is connected to a differentiating circuit comprising a relatively small capacitor 33 and a relatively small resistor 34. The output of the differentiating circuit is across the latter resistor and is connected directly to the two diodes 29 and 31. A second input circuit is connected to the flip-flop by way of a terminal 36 and a resistor 37 that is connected to the base of the transistor 14.

The other two flip-flop circuits 12 and 13 are quite similar to circuit 11 and have corresponding reference numbers with the addition of a "prime" for those in circuit 12 and a "double prime" for those in flip-flop 13. In addition flip-flop 12 has an output terminal 38 connected directly to the collector of transistor 14′, and flip-flop 13 has three output terminals: terminal 39 connected to the transistor 14″; terminal 41 connected to the output of the differentiating circuit at the junction of condenser 33″ and resistor 34″, and terminal 42 connected directly to the collector terminal of the transistor 16″.

Figure 2:
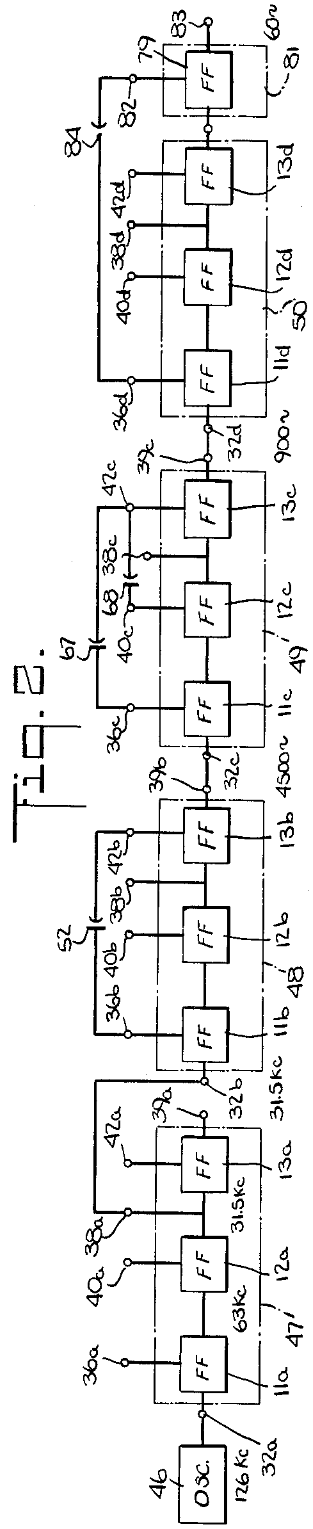
FIG. 2 shows interconnecting circuits for the frequency divider section of a synchronizing generator using the divider circuits of FIG. 1 and having elements to adjust the division ratio in accordance with this invention.

FIG. 2 is a block diagram showing use of a plurality of circuits of the type shown in FIG. 1, in the frequency divider section of a television synchronizing signal generator. In accordance with standard television synchronizing signal generator practice the signal whose frequency is to be divided is originally generated by an oscillator indicated by reference character 46. This oscillator operates at a frequency of 126 kilocycles per second, frequently abbreviated as "kc.," and is connected to the input terminal **32*a* of a first set of flip-flop circuits on a sub-chassis 47, which may be a printed circuit board, and which, in accordance with the present invention is substantially identical to several other sub-chassis 48–50 in the complete frequency divider. Each of these sub-chassis has the same set of input and output terminals as the others, and they are similarly numbered except for different suffix letters. Not all of the input and output terminals of any single one of the sub-chassis 47–50 is used, though the same sub-chassis may be used in place of any of the other sub-chassis 47–50** and would have different ones of its input and output terminals used depending upon which of the positions it occupied.

Subchassis 47 produces pulse signals having repetition rates of 31,500 pulses per second and 15,750 pulses per second. It is conventional to refer to these signals in terms of their fundamental frequencies of 31.5 kc. and 15.75 kc., which are one-fourth and one-eighth, respectively, of the 126 kc. frequency of oscillator 46. The 15.75 kc. pulse signal is available at terminal **39*a* and is an important signal in a complete television synchronizing signal generator since it is the basic signal for synchronizing operation of circuits that deflect the electron beams in television cameras and display devices to produce the individual, horizontal lines that make up the normal rectangular pattern of a television image. However, since there is no further use for the 15.75 kc. pulse signal in the frequency divider in FIG. 2, it will not be mentioned again. The 31.5 kc. pulse signal is obtained from terminal 38***a* and is used in deriving lower-frequency pulse signals in the remainder of the circuit of FIG. 2.

Output terminal 38*a* of the first sub-chassis 47 is connected to the input terminal 32*b* of a substantially identical sub-chassis 48 which is so arranged as to divide the frequency of the incoming 31.5 kc. pulse signal by the ratio of 7:1 to produce an output pulse signal of 4500 kc. at terminal 39*b*. In accordance with standard binary frequency divider practice the ratio of 7:1 is obtained by feeding back pulses from an output circuit to an input circuit of sub-chassis 48. In accordance with the present invention the feedback circuit includes a capacitor 52 connected in series between output terminal 42*b* and another input terminal 36*b*.

Figure 3:
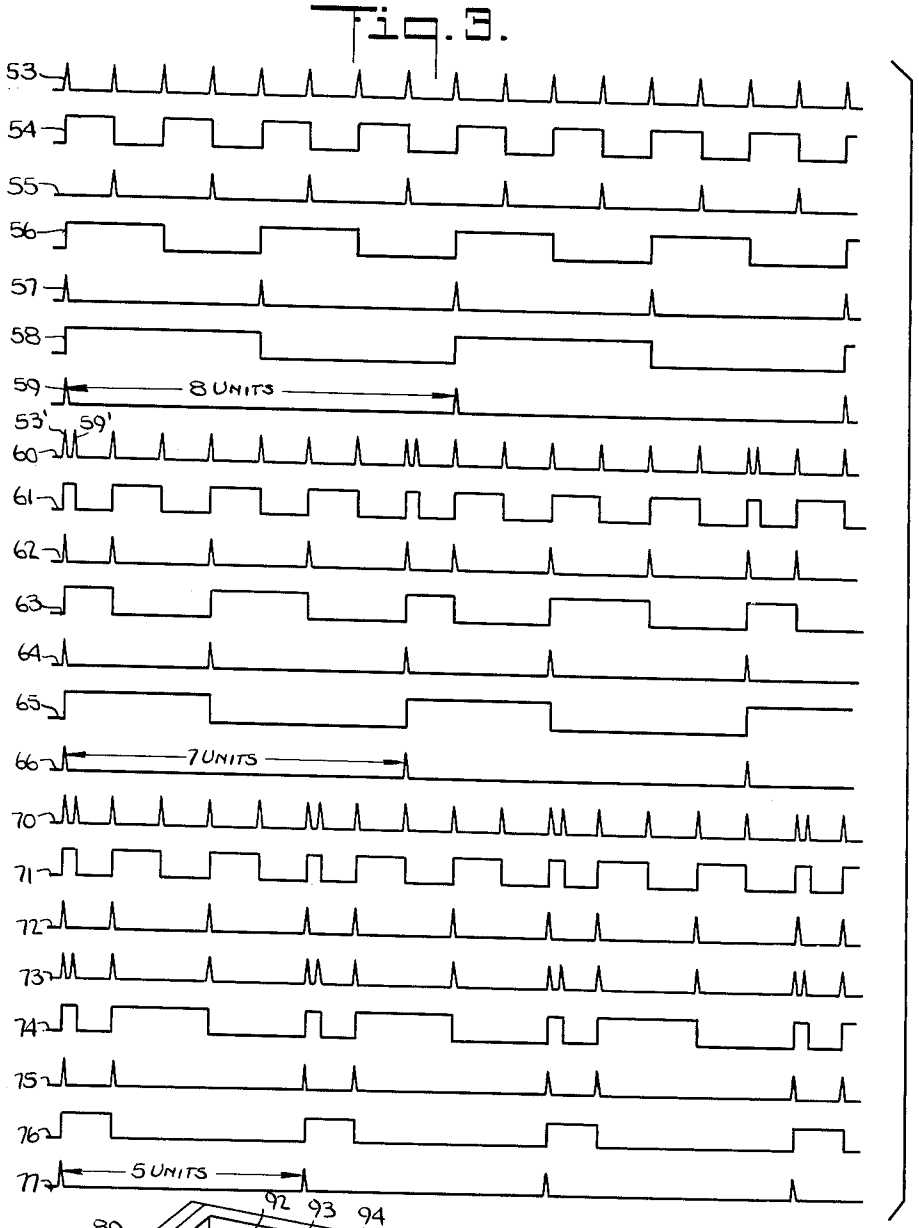
FIG. 3 shows voltage wave forms obtained in different modes of operation of the circuit in FIG. 1.

While the operation of binary frequency dividers is fairly well known, it will be very briefly described at this point in order to clarify the effect of capacitor 52. FIG. 3 is a series of pulse waveforms characteristic of those present when the binary frequency dividing circuit is operated. Waveform 53 is a series of positive-going pulses such as may be applied to any of the input terminals 32 in FIG. 2. To begin with, it may be considered that waveform 52 consists of a series of pulses recurring at a rate of 31,500 pulses per second and is therefore of the proper frequency to be applied to input terminal 32*b* of sub-chassis 48. The first flip-flop 11*b* in that sub-chassis is arranged so that it is triggered only by positive-going pulses, and each time it is triggered, it reverses its state of conductivity. Thus the output signal of flip-flop 11*b* applied to flip-flop 12*b* is indicated by waveform 54. Since it is common to differentiate the incoming signal to each of the flipflops, as described in connection with FIG. 1, and since flip-flop 12*b* is only triggered into operation by positive-going pulses, the differentiated shape produced by waveform 54 and with the negative-going pulses removed is indicated by waveform 55. It will be seen that the pulses of this signal occur at ½ the repetition rate of the pulses in waveform 53.

The pulse signal 55 causes a series of reversals of the state of conductivity of the flip-flop 12*b* to produce an output square wave 56 which is applied through another differentiating circuit to an input of flip-flop 13*b*. Differentiation of the square wave 56 results in a series of impulses indicated by waveform 57, which has a repetition rate ½ that of pulse wave 55 and ¼ that of pulse wave 53. The output signal of flip-flop 13 is indicated by another square wave 58 which in turn may be differentiated to produce pulse wave 59. As before, the repetition rate of pulses in the latter waveform is ½ that of pulses in the preceding input wave 57 and ⅛, or $\frac{1}{2}^n$, that of pulses in the incoming signal 53, where "*n*" is the number of flip-flops in series on the sub-chassis 48.

By adding the pulses of signal 59 obtained from the output terminal 42 back to a second input terminal 36*b* by way of the capacitor 52, a modification of the ratio of division may be obtained. While the pulses in waveform 59 appear to be substantially directly under each other and therefore coincident in time, there is unavoidably a slight delay between the time of operation of one flip-flop circuit and the time of operation of the succeeding flip-flop circuit. Furthermore, if desirable, an additional time delay may be added although the circuit has been found to operate perfectly well without any additional delay.

The actual delay between occurrence between each of the pulses in pulse wave 59 and the occurrence of the nearly simultaneous pulses in waveform 53 is exaggerated somewhat in order to illustrate a pulse signal 60 which shows the pulse 59' substantially lagging behind the pulse 53'. The pulse signal 60 is obtained by transmitting the pulse wave 59 back through the capacitor 52 to the second input terminal 36*b* and transmitting the initial pulse wave 53 directly to the first input circuit 32*b*. Because of the above-described operation of flip-flop 11*b* its state of conductivity reverses at the occurrence of each successive positive impulse. Therefore, instead of generating a square wave of uniformly spaced pulses, the addition of pulse 59' results in making the output wave of flip-flop 11*b* have the shape shown by reference character 61. When this wave is differentiated and the positive-going portions selected, a pulse wave shown by reference character 62 is formed; and when this waveform is used to actuate the flip-flop 12*b*, the waveform 63 is produced. Successive differentiation of the latter waveform produces the pulse waveform 64 and application of this waveform to the third flip-flop 13*b* produces an output waveform 65. Finally, differentiation of this output wave form produces a pulse waveform 66, and by counting it may be seen that the time interval between successive pulses of waveform 66 is seven times the time interval between successive pulses of waveform 53, whereas successive pulses 59 are spaced apart by eight such units of time. The operation of sub-chassis 48 has thus been modified from its normal counting ratio of 8:1 to a lower one of 7:1 by the addition of a feedback capacitor 52 which is not on the sub-chassis 48 itself but is supported by the main chassis into which the sub-chassis are inserted. Since the input signal to sub-chassis 48 has a repetition rate of 31,500 pulses per second, the output signal 66 has a repetition rate of 31,500/7, or 4500, pulses per second.

Referring back to FIG. 2, the output pulse wave from terminal 39*b* of sub-chassis 48 is connected directly to the input terminal 32*c* of a successive sub-chassis 49. This sub-chassis is substantially identical to that of sub-chassis 48 but by virtue of a modifying feedback arrangement, which is external to the sub-chassis 49 itself, it is made to have a different frequency dividing ratio than it would normally have and different from the ratio of sub-chassis 48. Sub-chassis 49 has two feedback capacitors from the output terminal 42*c*. One of these capacitors, identified by reference character 67, is connected directly between terminal 42*c* and input terminal 36*c*. The other feedback capacitor 68 is connected between the output terminal 42*c* and the input terminal 40*c* of flip-flop 12*c*.

Operation of this modified sub-chassis is also shown in FIG. 3. The basic operation of the sub-chassis is shown by waveform 53–59 and the effect of capacitor 67 is to add pulse 59'' immediately after pulse 53'' so that the effective synchronizing, or actuating, signal applied to the first flip-flop 11*c* in the sub-chassis 49 is indicated by waveform 70. This produces an output signal from flip-flop 11*c* as shown by reference character 71, and when this wave form is differentiated as described hereinabove, it produces a waveform 72. Because of the second feedback capacitor 68 the same pulses from waveform 59 are inserted at two points i.e., the input terminal 40*c* as well as the input terminal 46*c*, thus producing a waveform 73 as a triggering voltage for flip-flop 12*c*. This causes the flip-flop 12*c* to produce an output signal as shown by reference character 74, and when this is differentiated, it produces a pulse wave 75. Pulse wave 75 acts as a synchronizing trigger signal for the third flip-flop circuit 13*c* and produces at the output thereof a signal 76 which when differentiated produces a pulse wave 77. Examination of the latter wave shows that the pulses are spaced apart by five units of time as compared with the pulses of waveform 53 which are spaced apart by one unit of time. This ratio of 5:1 differs from the binary frequency division ratio of 8:1, which would be obtained if the sub-chassis 49 were operated without capacitors 67 and 68. Since the third sub-chassis 49 divides the frequency of the incoming pulse wave by 5:1, the output pulse signal has a repetition rate of 900 pulses per second.

The fourth substantially identical sub-chassis 50 is part of a counting circuit which divides the incoming pulses in the ratio of 15:1. It will be recognized that the number "15" is one less than $2^4$. Therefore, by taking four binary flip-flops in series, the normal frequency reduction of 16:1 (which is the same as saying $2^4$:1) and by feeding back the output pulse of the fourth flip-flop into an input terminal of the first flip-flop, the normal frequency division ratio may be changed from 16:1 to 15:1. Rather than build a special sub-chassis having four flip-flops on it, it is most convenient and results in the greatest savings, due to the possibility of using mass production techniques, to use a three flip-flop sub-chassis 50, which is substantially identical to the sub-chassis 47–49, and then add a single additional flip-flop 79 in a separate sub-chassis 81. In this instance only the single output terminal 39*d* of the sub-chassis 50 is used and this is connected directly to the input of the flip-flop 79. This latter flip-flop may be identical with any of the flip-flops, for example, flip-flop 13, of FIG. 1 having an output terminal 82 equivalent to terminal 42 and an output terminal 83 equivalent to terminal 39. A capacitor 84 is connected in series between terminal 82 and the input terminal 36*d* of sub-chassis 50. The output pulse repetition rate or frequency at terminal 83 is 1/15 of that of the signal at an input terminal 32*d* and is therefore 60 pulses per second.

Figure 4:
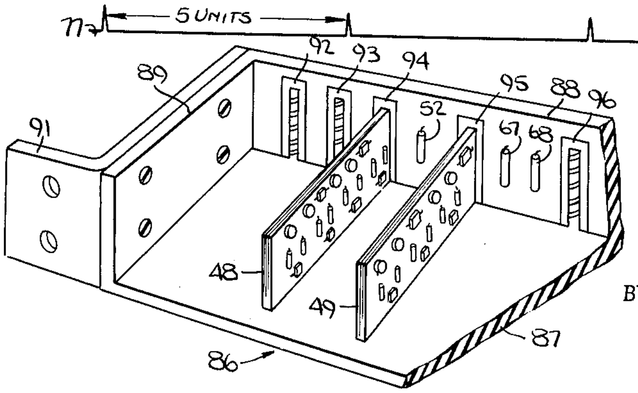
FIG. 4 shows a partial prospective view of a synchronizing generator and sub-chassis arranged therein in accordance with this invention.

FIG. 4 shows a typical mechanical arrangement of the electrical components illustrated in the circuit diagrams of FIGS. 1 and 2. The mechanical arrangement includes a chassis 86 on which the components are mounted and which has a floor 87, a back wall 88, and an end wall 89 to which a mounting flange 91 is attached. The back wall 88 is provided with a plurality of multi-terminal sockets 92–96, along with other sockets that are not shown in the fragmentary view presented. The principles of construction are amply demonstrated by the portion of the chassis 86 that is shown and the reminder has therefore been omitted for the purpose of simplifying the description.

The back wall 88 may be made of insulating material and if so it is possible to mount electrical components directly on it using one of the usual printed circuit techniques. Several such components are illustrated including the capacitor 52 which is connected between pins of the socket 94 so that when the subchassis 48 is plugged into the socket, capacitor 52 will be connected between terminals 36*b* and 42*b* (see FIG. 2) of the sub-chassis. Capacitors 67 and 68, which are similarly connected to the sub-chassis 49, are also mounted on the main chassis 86. The sub-chassis 48 and 49, being substantially identical to each other, need only be plugged into the sockets 94 and 95, respectively, in order to be connected to the proper capacitors for operation as described in connection with FIG. 2 and in this way it is unnecessary to manufacture different sub-chassis for the different division ratios. The exact arrangement of sub-chassis and main chassis may of course be varied without limitation so long as the principle of utilizing identical sub-chassis and modifying the operation thereof by components supported directly or indirectly by the main chassis 86 is followed.

While the invention described hereinabove has been considered in terms of specific embodiments, it will be apparent to those skilled in the art that modifications may be made therein without departing from the true scope as defined by the following claims.

What is claimed is:

1. A frequency divider comprising: a main circuit support structure; a first capacitor having two terminals and being supported by said structure; a second and third capacitor each having two terminals, one terminal of said second capacitor being connected to one terminal of said third capacitor to form a common terminal; a plurality of subchassis, each having substantially identical binary frequency dividing circuits thereon and each chassis mechanically and electrically engaging said support structure, each of said dividing circuits comprising first, second and third binary flip-flop circuits connected in series, a first input terminal connected to said first of said binary circuits to receive a signal to be frequency divided, and a second input terminal connected to said first of said binary circuits, and an output terminal connected to said third binary circuit, a connection on said support structure between the output terminal of one of said chassis and one terminal of said first capacitor, and a second connection between the second input terminal of the same chassis and the other terminal of said first capacitor to feed back an electrical signal to change the frequency dividing ratio of the binary circuit on said one of said chassis to a value different from its normal binary value, a connection between said output terminal of a second one of said chassis and said common terminal, and a connection between the other terminal of said second capacitor and the second input terminal of said second one of said chassis, the other terminal of said third capacitor being connected to the third input terminal of the binary circuit on said second one of said chassis to change the frequency dividing ratio of said last-named dividing circuit to a value different from its normal binary value and differnt from the value of said dividing circuit on said one of said chassis.

2. A frequency divider comprising: a main circuit support structure; at least one passive electrical impedance thereon; a plurality of sub-chassis, each having substantially identical binary frequency dividing circuits thereon, and each mechanically and electrically engaging said support structure, the circuit on at least one of said sub-chassis being electrically connected to said electrical impedance to change the frequency-dividing ratio of said circuit to make said ratio different from its normal binary ratio.

3. A frequency divider comprising: a main circuit support structure; a first frequency dividing circuit comprising a plurality of electrical impedances supported thereon; a plurality of sub-chassis, each having substantially identical binary frequency dividing circuits thereon, and each mechanically and electrically engaging said support structure, the circuit on at least one of said sub-chassis being electrically connected to one of said electrical impedances to change the frequency-dividing ratio of said circuit to make said ratio different from its normal binary ratio.

4. A frequency divider comprising: a main circuit support structure; a capacitor supported thereon; a plurality of sub-chassis, each having substantially identical binary frequency dividing circuits thereon and each chassis mechanically and electrically engaging said support structure, each of said dividing circuits having at least two input terminals and at least one output terminal, the output terminal of one of said dividing circuits being connected to one terminal of said capacitor and one of the input terminals of the same dividing circuit ,being connected to the other terminal of said capacitor to change the frequency-dividing ratio of said one dividing circuit to a value different from its normal binary value.

References Cited by the Examiner

UNITED STATES PATENTS

| | | | |
|---|---|---|---|
| 2,542,685 | 2/51 | Lawrence et al. | 328—48 |
| 2,563,841 | 8/51 | Jensen | 328—39 |
| 2,999,207 | 9/61 | Quynn | 328—48 |
| 3,008,245 | 11/61 | Meuche | 317—101 X |
| 3,074,632 | 1/63 | Braun et al. | 328—48 |

ARTHUR GAUSS, *Primary Examiner.*